(12) United States Patent
Kim et al.

(10) Patent No.: US 9,124,462 B2
(45) Date of Patent: *Sep. 1, 2015

(54) FLEXIBLE PRBS ARCHITECTURE FOR A TRANSCEIVER

(71) Applicant: Texas Instruments Incorporated, Dallas, TX (US)

(72) Inventors: Seuk B. Kim, Plano, TX (US); Tpinn R. Koh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 259 days.

This patent is subject to a terminal disclaimer.

(21) Appl. No.: 13/660,841

(22) Filed: Oct. 25, 2012

(65) Prior Publication Data

US 2014/0122552 A1 May 1, 2014

(51) Int. Cl.
H04L 25/03 (2006.01)
G06F 7/58 (2006.01)

(52) U.S. Cl.
CPC .......... H04L 25/03866 (2013.01); G06F 7/582 (2013.01)

(58) Field of Classification Search
USPC ................................. 708/250–256
See application file for complete search history.

(56) References Cited

U.S. PATENT DOCUMENTS 4,703,474 A * 10/1987 Foschini et al. ............... 370/441
4,744,104 A 5/1988 Pospischil
5,267,316 A 11/1993 Merino Gonzalez et al.
6,167,515 A 12/2000 Lin
6,820,230 B2 11/2004 Sweeney
6,907,062 B2 6/2005 Carlson
7,124,158 B2 10/2006 Ruthstein et al.
7,414,112 B2 8/2008 Grimaldi et al.
7,486,725 B2 2/2009 Chen et al.
7,505,589 B2 3/2009 Lablans
2003/0014451 A1 1/2003 Peyser et al.
2003/0217214 A1* 11/2003 Calvignac et al. ............ 710/305
2006/0093146 A1* 5/2006 Ungerboeck et al. ......... 380/268
2007/0008997 A1 1/2007 Mochizuki et al.
2007/0098160 A1 5/2007 Lablans
2009/0010362 A1 1/2009 Thaler
2011/0145547 A1* 6/2011 Vorbach ......................... 712/37

FOREIGN PATENT DOCUMENTS

RU 2292644 1/2007

OTHER PUBLICATIONS

IEEE Standard 802.3-2008.

* cited by examiner

Primary Examiner — Chuong D Ngo
Assistant Examiner — Calvin M Brien
(74) Attorney, Agent, or Firm — Tuenlap D. Chan; Frank D. Cimino

(57) ABSTRACT

An apparatus is provided. The apparatus comprises a polynomial register having a plurality of bits, a first bus, a second bus, and a transceiver that is coupled to the first bus, the second bus, and the polynomial register. The polynomial register is configured to store a user-defined polynomial, and the transceiver includes a pseudorandom bit sequence (PRBS) generator is configured to generate a scrambled signal from the user-defined polynomial and a PRBS checker that is configured to generate a descrambled signal from a second signal using the user-defined polynomial.

14 Claims, 4 Drawing Sheets

FLEXIBLE PRBS ARCHITECTURE FOR A TRANSCEIVER

TECHNICAL FIELD

The invention relates generally to a transceiver and, more particularly, to a physical transceiver (PHY) having a flexible architecture.

BACKGROUND

Turning to FIG. 1, an example of a conventional system 100 can be seen. In this system 100, hosts 102-1 to 102-N (which can be; for example, a computer, router, or switch) are able to communicate with one another over communications medium 112 (which can; for example, be an optical fiber, backplane, or twisted pair) through network interfaces 104-1 to 104-N. In this example, the network interfaces 104-1 to 104-N employ Ethernet over Electrical Backplanes and, more specifically, 10 GBase-KR. A description of 10 GBase-KR can be found in the Institute of Electrical and Electronics Engineers (IEEE) standard 802.3-2008 (which is dated Dec. 26, 2008 and which is incorporated by reference herein for all purposes). These network interfaces 104-1 to 104-N employ media access control (MAC) circuits 106-1 to 106-N that communicate with PHYs 110-1 to 110-N via, media independent interfaces (MIIs) 108-1 to 108-N (which can typically have half-duplex or full-duplex operation), each of which is described in IEEE standard 802.3-2008.

Of interest here, however, are PHYs 110-1 to 110-N, and, as can be seen in greater detail in FIG. 2, PHYs 110-1 to 110-N (hereinafter PHY 110), PHY 110 employs several sublayers. This PHY 110 can be an independent integrated circuit (IC) or can be integrated with a MAC circuit (i.e., MAC circuit 106-1) and an MII 108. As shown, the PHY 110 is generally comprised of physical medium dependent (PMD) sublayer logic 212; physical medium attachment (PMA) sublayer logic 210, forward error correction (FEC) sublayer logic 204, and physical coding (PCS) sublayer logic 202. These sublayer logic circuits 202, 204, 210, and 212 interact with one another to provide communications between MII 108 and communications medium 112. For transmission, the FEC sublayer logic 204 employs an encoder 206 as described in IEEE standard 802.3-2008, clause 74, and, for reception, the FEC sublayer logic 204 employs a decoder 208 as described in IEEE standard 802.3-2008, clause 74.

As can be seen in FIG. 3, the PCS sublayer logic 202 can be a transceiver, having a PCS transmitter 302 and a PCS receiver 304. The transmitter 302, in this example, is able to receive data from MII 108, encode the data with encoder 306, scramble the encoded data with scrambler 308, and convert (so as to be used by FEC sublayer logic 204) with gearbox 310. The receiver 304, in this example, is able to convert data from FEC sublayer logic 204 using gearbox 312, descramble the data with descrambler 314, and decode the data (for use with MII 108) with decoder 316. The details of PCS sublayer logic 202 can, for example, be seen in IEEE standard 802.3-2008, clauses 48 and 74.

Of interest here are the scrambler 308 and descrambler 314. In this example, the scrambler 308 and descrambler 314 are able to perform data scrambling/descrambling and error checking One purpose in scrambling/descrambling data with the PHYs 110-1 to 110-N is to substantially randomize the data to reduce the impact of electromagnetic interference (EMI) and improve signal integrity. This is typically accomplished by the use of a pseudorandom bit sequence (PRBS) generated with a specified polynomial. For example, for 8b/10b encoding, a PRBS-7 (or $1+x^6+x^7$) can be employed, and, for synchronous optical networking or SONET (as specified in ITU 0.150), PRBS-23 (or $X^{23}+X^{18}+1$). Similarly, this PRBS signaling can be employed for error checking.

However, as demonstrated above, one polynomial is generally not applicable to all standards (e.g., 802.3-2008 and SONET); each standard usually specifies its own polynomial. Conventionally, this meant that each PHY (e.g., 110-1) would be designed for a particular standard (e.g., PRBS-7 for 802.3-2008) and would lack the flexibility to be used with other standards. A reason for this is that the serial and parallel implementations for the PHYs (e.g., 110-1) would be too costly in terms of area, price, and power consumption to be generally applicable.

Therefore, there is a need for a flexible transceiver architecture.

Some examples of conventional systems are: U.S. Pat. Nos. 4,744,104; 5,267,316; 6,820,230; 6,907,062; 7,124,158; 7,414,112; 7,486,725; 7,505,589; U.S. Patent Pre-Grant Publ. No. 2003/0014451; U.S. Patent Pre-Grant Publ. No. 2007/008997; and U.S. Patent Pre-Grant Publ. No. 2007/0098160.

SUMMARY

In accordance with an embodiment of the present invention, an apparatus is provided. The apparatus comprises a polynomial register having a plurality of bits, wherein the polynomial register is configured to store a user-defined polynomial; a first bus; a second bus; a transceiver that is coupled to the first bus, the second bus, and the polynomial register, wherein the transceiver includes: a pseudorandom bit sequence (PRBS) generator is configured to generate a scrambled signal from the user-defined polynomial; and a PRBS checker that is configured to generate a descrambled signal from a second signal using the user-defined polynomial.

In accordance with an embodiment of the present invention, the first bus further comprises a first input bus and a second input bus, and wherein the second bus further comprises a first output bus and a second output bus, and wherein the PRBS generator is coupled to the first output bus, and wherein the PRBS checker is coupled to the second input bus.

In accordance with an embodiment of the present invention, the first input bus has a programmable width.

In accordance with an embodiment of the present invention, the PRBS checker further comprises: a first matrix circuit that is configured to include a first matrix corresponding to the user-defined polynomial; a second matrix circuit that is configured to include a first matrix corresponding to the user-defined polynomial; a first multiplier that is coupled to the second matrix circuit and that is coupled to the respective one of the encoder and the second input bus; a data register that is coupled to the second input bus; a second multiplier that is coupled to the first matrix circuit and the data register; an XOR circuit that is coupled to the first and second multipliers; and an error counter that is coupled to the XOR circuit.

In accordance with an embodiment of the present invention, the data register further comprises a first data register, and wherein the PRBS generator further comprises: a third matrix circuit that is configured to include a third matrix corresponding to the user-defined polynomial; a third multiplier that is coupled to the third matrix circuit; a first multiplexer that is coupled to the third multiplier and that is configured to receive a seed; a second data register that is coupled to the first multiplexer and the second data register.

In accordance with an embodiment of the present invention, the transceiver further comprises a detector that is coupled to the PBRS generator and the PRBS checker.

In accordance with an embodiment of the present invention, the polynomial register has 32 bits.

In accordance with an embodiment of the present invention, an apparatus is provided. The apparatus comprises a media access control (MAC) circuit; a interface that is coupled to the MAC circuit; a physical transceiver (PHY) having: a polynomial register having a plurality of bits, wherein the polynomial register is configured to store a user-defined polynomial; a first bus that is coupled to the interface; a second bus; a transceiver that is coupled to the first bus, the second bus, and the polynomial register, wherein the transceiver includes: a pseudorandom bit sequence (PRBS) generator is configured to generate a scrambled signal from the user-defined polynomial; and a PRBS checker that is configured to generate a descrambled signal from a second signal using the user-defined polynomial.

In accordance with an embodiment of the present invention, the PHY further comprises a detector that is coupled to the PBRS generator and the PRBS checker.

In accordance with an embodiment of the present invention, the apparatus further comprise a communications medium that is coupled to the PHY.

In accordance with an embodiment of the present invention, the detector is configure use the PRBS generator and the PRBS checker to characterize the communications medium.

In accordance with an embodiment of the present invention, the apparatus further comprises a host that is coupled to the MAC circuit.

In accordance with an embodiment of the present invention, a method is provided. the method comprises retrieving a user-defined polynomial from a polynomial register having a plurality of bits; generating first, second, and third matrices based at least in part on the user-defined polynomial; generating a first PRBS data set using the first matrix; transmitting the first PRBS data set over a communications medium; receiving a second PRBS data set over the communications medium; and determining a number of bit errors with the second PRBS data set using the second and third matrices.

In accordance with an embodiment of the present invention, the method further comprises: adjusting the first PRBS data set; and repeating the steps of transmitting, receiving, and determining.

In accordance with an embodiment of the present invention, the method further comprises characterizing the communication channel based at least in part on the number of bit errors.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
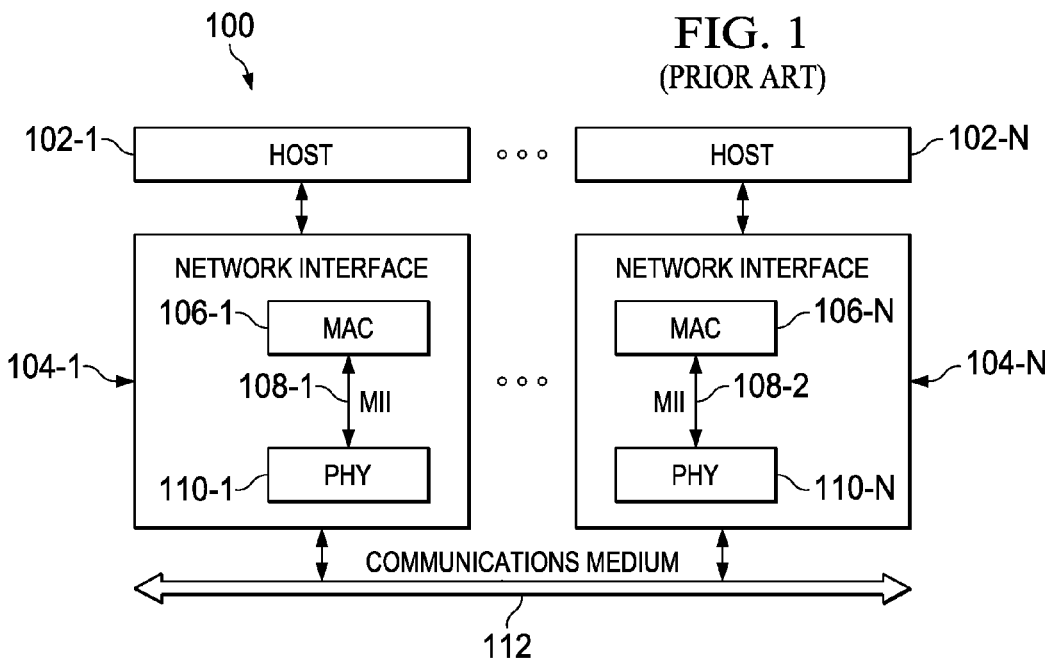
FIG. 1 is a diagram of an example of a conventional system.
Figure 2:
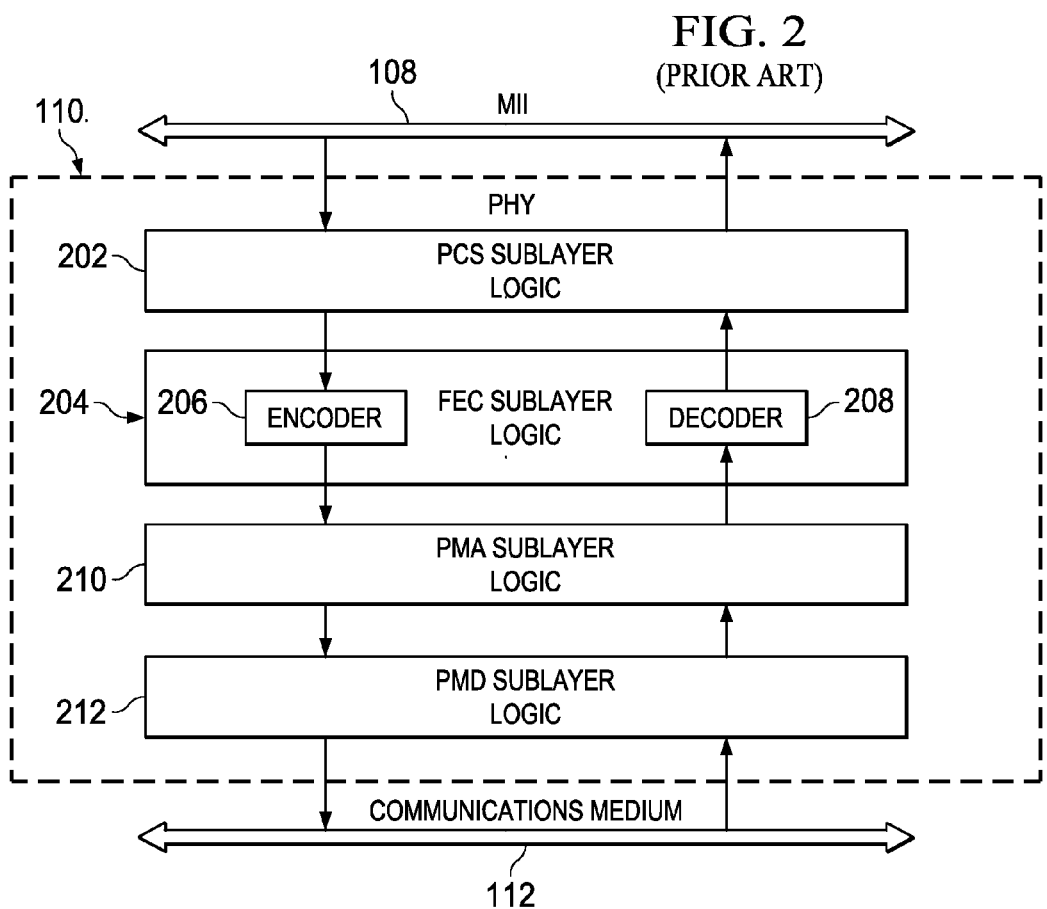
FIG. 2 is a diagram of an example of a PHY of FIG. 1.

Refer now to the drawings wherein depicted elements are, for the sake of clarity, not necessarily shown to scale and wherein like or similar elements are designated by the same reference numeral through the several views.

Figure 3:
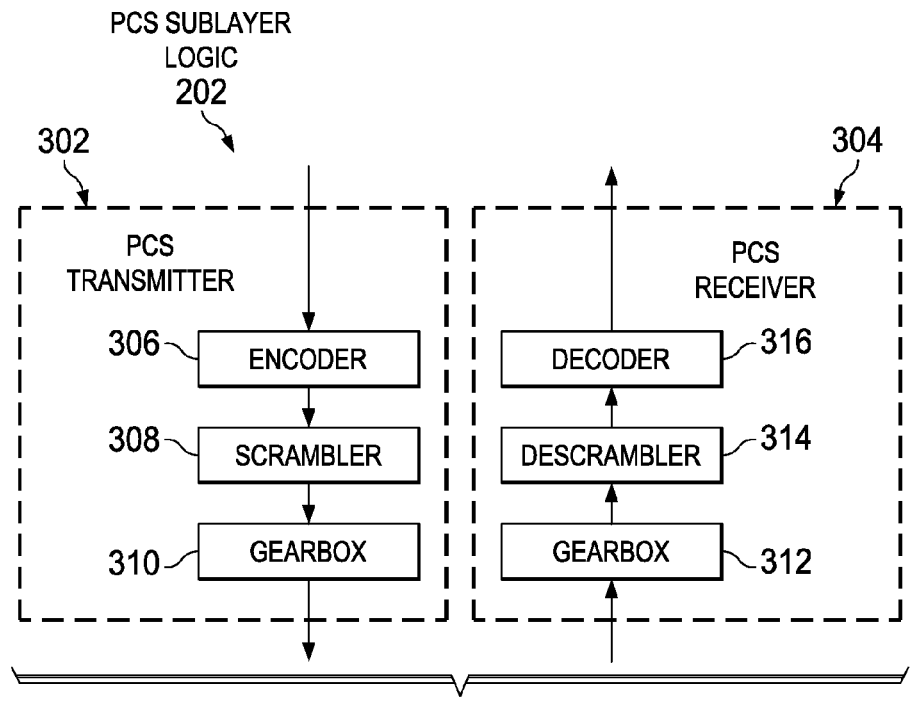
FIG. 3 is a diagram of a PCS sublayer logic of FIG. 2.
Figure 4:
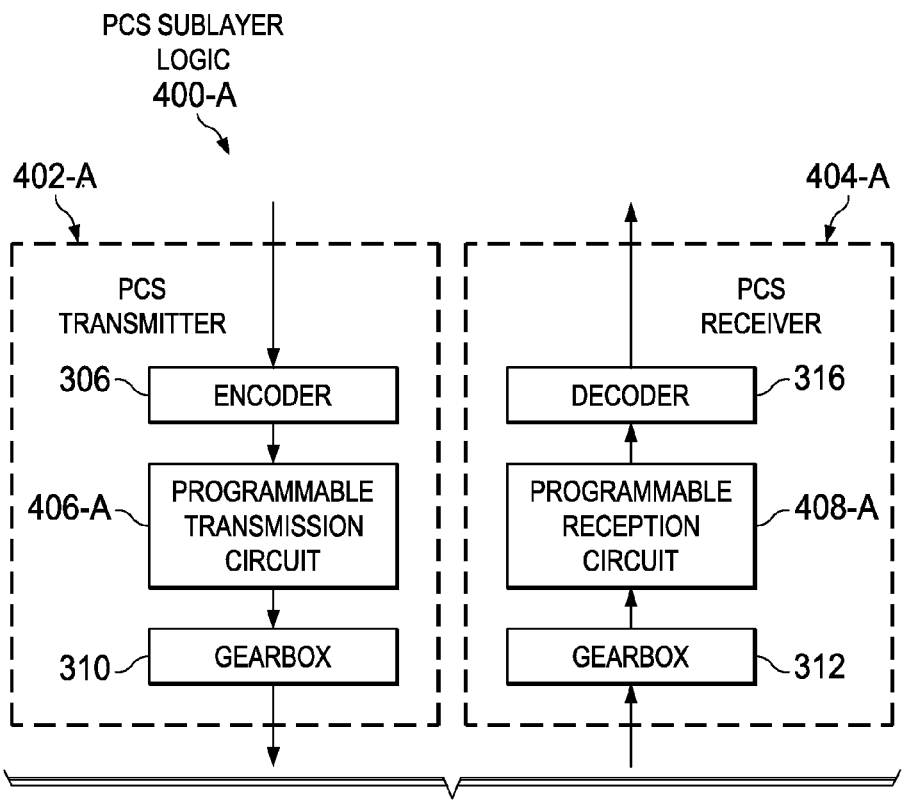
FIGS. 4 and 5 are diagrams of an example of a PCS sublayer logic in accordance with embodiments of the present invention.
Figure 5:
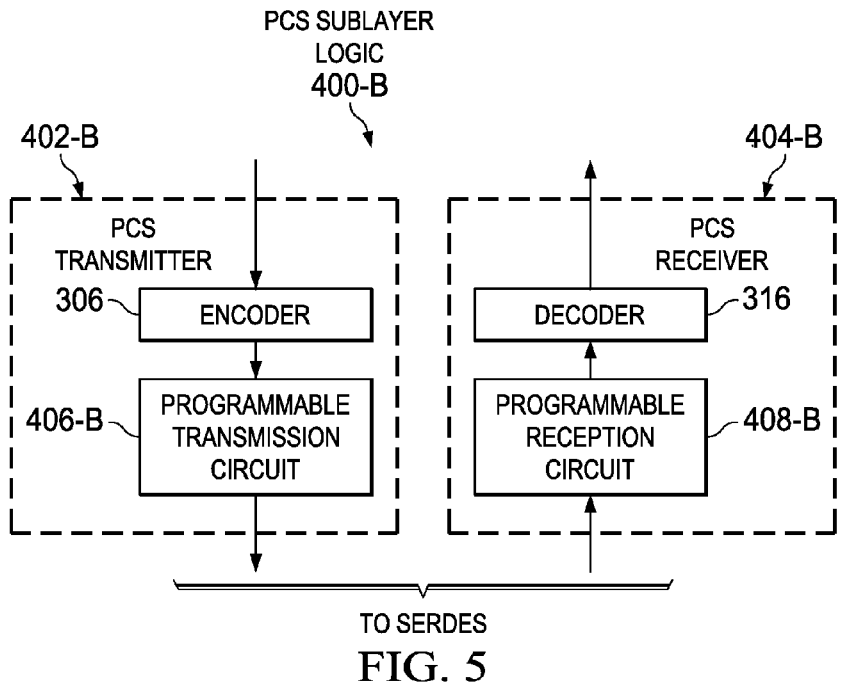

Turning to FIGS. 4 and 5, example of the transceivers 400-A and 400-B can be seen. As shown with the example shown in FIG. 4, transceiver 400-A can be used as part of PCS sublayer logic 202 of FIG. 3, and, as shown in the example of FIG. 5, transceiver 400-B can be used to communicate with a serializer/deserializer (SERDES) device. Other implementations can be used with the transceivers 400-A and 400-B, including implementations that omit encoder 306 and decoder 316. In each case, the transceivers 400-A and 400-B employ programmable transmission and reception circuits 406-A/406-B and 408-A/408-B that can perform scrambling/descrambling and error checking based on a user-specified or user-defined polynomial.

Figure 6:
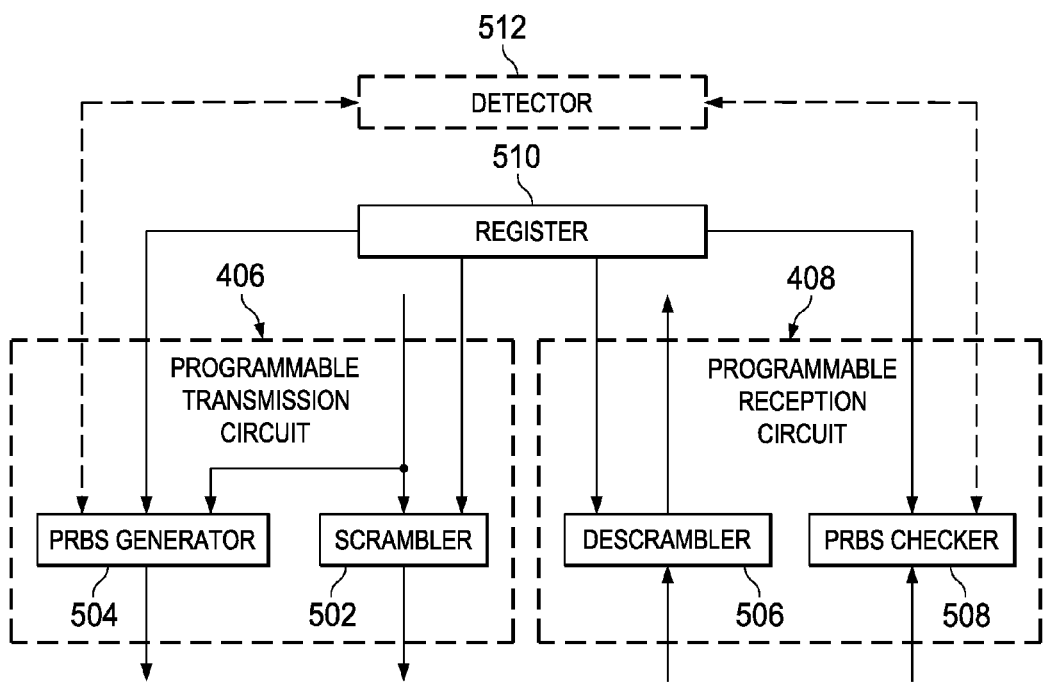
FIG. 6 is a diagram of an example of the programmable transmission and reception circuits of FIGS. 4 and 5.

Turning to FIG. 6, the programmable transmission and reception circuits 406-A/406-B and 408-A/408-B (which are referred to hereinafter as 406 and 408) can be seen in greater detail. Collectively, circuits 406 and 408 can be considered to be a transceiver. As shown in this example, circuit 406 generally comprises a PRBS generator 504 and a scrambler 502, while circuit 408 generally comprises a descrambler 506 and PRBS checker 508. As shown, there can also be a detector 512 that is in communication with the PRBS generator 504 and 508. This detector 512 can cause the PRBS generator 504 to transmit PRBS data sets over a communications medium (e.g., 112) and receive the bit errors from the PRBS checker 508. Based on this information, the detector 512 can search for optimal settings by transmitting repeated PRBS data sets (after each adjustment iteration) and receiving the bit errors, or it can characterize the communication channel (e.g., 114), allowing the detector 512 to detect the communication medium type (e.g., twist pair, optical, and so forth). Additionally, the busses that communicate with the scrambler 502 and descrambler 506 can have a programmable width (e.g., a maximum width of 32 bits but adjustable down to 1 bit).

Also, as can be seen in the example of FIG. 6, there is a polynomial register 510 shown. This polynomial register 510 typically has a predetermined width or number of bits (e.g., 32 bit) that is accessible to a user. The user is able to write to this register 510 so as to store a user-defined polynomial. As an example, if a user chooses to use PRBS-7 (which has a polynomial of $1+x^6+x^7$) for scrambler 502, the user can write the following to a 32-bit register (e.g., register 510):

$$0 0 0 0 0 0 0 0 0 0 0 0 0 0 0 0 0 0 0 0 0 0 0 0 0 1 1 0 0 0 0 0 1$$

Thus, for an example register (e.g., 510) having a width of 32 bits, the user can specify any of approximately 2×109 polynomials. This user-defined polynomial (which can be retrieved from register 510) can be used by the scrambler 502, PRBS generator 504, descrambler 506, and PRBS checker 508 accordingly. Alternatively, there can be multiple polynomial registers (e.g. 510), and each of the scrambler 502, PRBS generator 504, descrambler 506, and PRBS checker 508 may have a separate polynomial register (e.g., 510).

Figure 7:
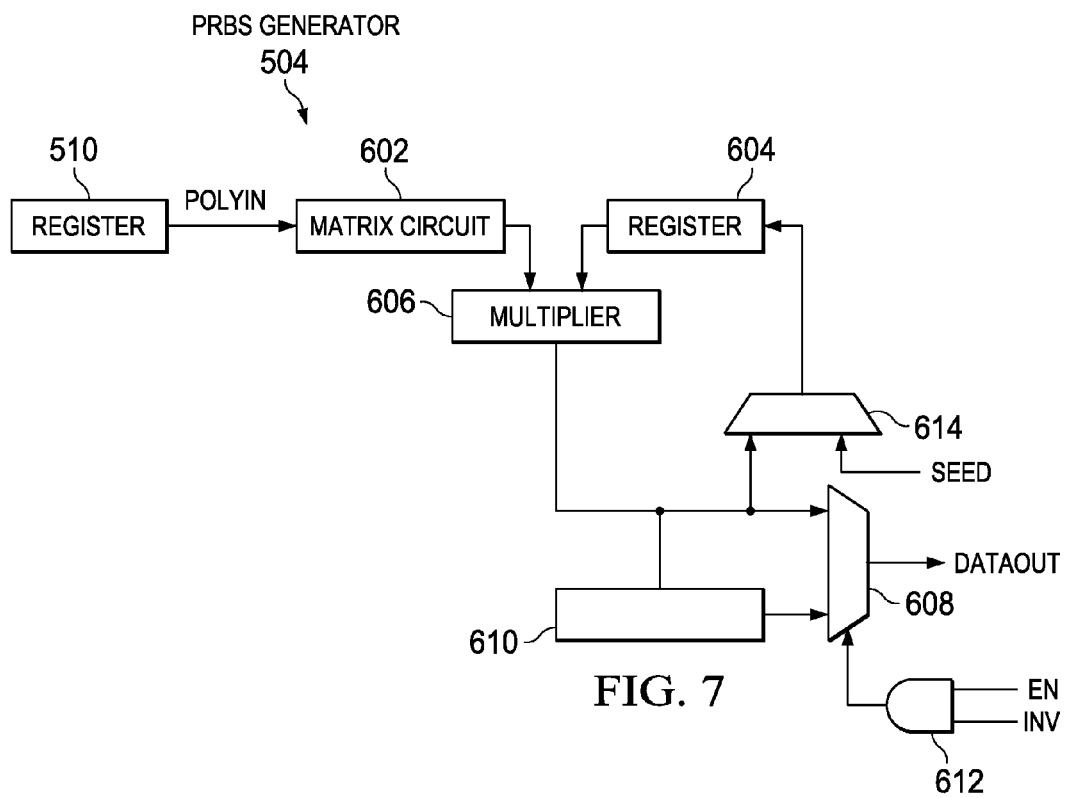
FIG. 7 is a diagram of an example of the PRBS generator of FIG. 6.
Figure 8:
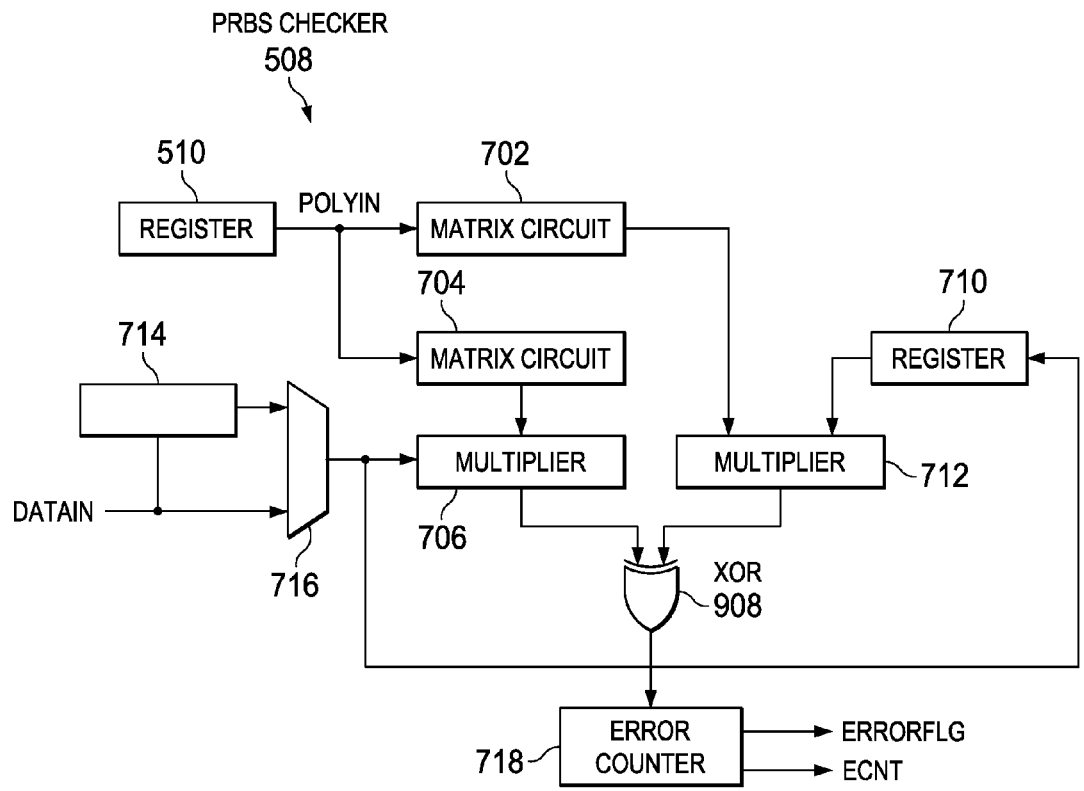
FIG. 8 is a diagram of an example of the PRBS checker of FIG. 6.

Turning to FIGS. 7 and 8, an example of the PRBS generator 504 and PRBS checker 508 can be seen in greater detail. Each of the example PRBS generator 504 and PRBS checker 508 use a user-defined polynomial that can be retrieved from register 510. One of the purposes in having a PRBS system (e.g., PRBS generator 504 and PRBS checker 508) is to allow for bit error testing of high speed serial links, and there are many communications standards or protocols that define or call out specific polynomials (e.g., PRBS-7). The PRBS generator 504 and PRBS checker 508 shown in this example are generally independent of the communication protocol or standard and can be used for nearly all known standards.

The PRBS system (e.g., PRBS generator 504 and PRBS checker 506) in this example is based in part on the generation of polynomial state and data matrices (which can respectively be referred to as the P-matrix and D-matrix). In operation, the signal POLY (which generally corresponds to the user-defined polynomial stored in register 510) can be used to generate matrices, which can be referred to. The P- and D-matrices $\underline{P}$ and $\underline{D}$ are typically square binary matrices that are a function of or based at least in part on the user-defined polynomial. The basis for forming the P- and D-matrices $\underline{P}$ and $\underline{D}$ are identity matrices $\underline{I}_P$ and $\underline{I}_D$ (respectively), which typically have uniquely assigned vectors for each column of the first row of the P- and D-matrices $\underline{P}$ and $\underline{D}$ (i.e., $P_{0,j}$ and $D_{0,j}$). An example of identity matrix $\underline{I}_P$ can be seen below:

$$\begin{bmatrix}
1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1
\end{bmatrix}$$

The identity matrix $\underline{I}_D$ is generally comprised of the matrix $\underline{I}_P$ that is shifted or adjusted based on the desired input bus width. For example, the identity matrix $\underline{I}_D$ (which is derived from the matrix $\underline{I}_P$ shown above) can be as follows for a 20-bit bus width:

$$\begin{bmatrix}
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1
\end{bmatrix}$$

An adjustment vector $\vec{A}$ is also determined. Typically, when the signal POLY1 is transmitted, the lowest bit is truncated, and a '0' is appended to signal POLY1 to form adjustment vector $\vec{A}$. For example, with the PRBS-7 polynomial used above, the adjustment vector A would be:

$$0\ 0\ 0\ 0\ 0\ 0\ 0\ 0\ 0\ 0\ 0\ 0\ 0\ 0\ 0\ 0\ 0\ 0\ 0\ 0\ 0\ 0\ 0\ 0\ 0\ 1\ 1\ 0\ 0\ 0\ 0\ 0$$

The P- and D-matrices $\underline{P}$ and $\underline{D}$ can then be determined.

Looking first to the P-matrix $\underline{P}$, it can be determined on a row-by-row basis through the use of a set of matrices (e.g., 32-32×32 matrices), which can be referred to a working matrices $\underline{WPM[r]}$, where r denote the P-matrix $\underline{P}$ row. These working matrices $\underline{WP[r]}$, in this example, are based at least in part on the identity matrix $\underline{I_P}$ and can be determined using the following formula:

$$\underline{WP[r]} = \begin{cases} \underline{WP[0]} = \underline{I_P} \\ WP_{i,j}[r] = WP_{i-1,j-1}[r],\ 1 \leq r,\ i \leq n;\ 2 \leq j \leq n \\ WP_{i,0}[r] = FNP[r],\ 1 \leq r \leq n \end{cases} \quad (1)$$

where $$\overrightarrow{FNP[r]} = (\overrightarrow{WP_j[r-1]} \oplus \vec{A}) \cdot \ldots \cdot (\overrightarrow{WP_0[r-1]} \oplus \vec{A}) \quad (2)$$

The P-matrix $\underline{P}$ can then be extracted from working matrices $\underline{WP[r]}$ by application of the following equation:

$$P_{i,j} = \begin{cases} 0,\ i > BW \\ WP_{i,j}[BW - 1],\ \text{otherwise} \end{cases} \quad (3)$$

where BW is the bus width. For example, with the PRBS-7 polynomial used above and a 20-bit bus width BW, the P-matrix $\underline{P}$ should be:

$$\begin{bmatrix}
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 \\
\vdots \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 1 & 0 & 0 & 1 & 1
\end{bmatrix}$$

Similarly, with D-matrix $\underline{D}$, it can be determined on a row-by-row basis through the use of a set of matrices (e.g., 32-32×32 matrices) or working matrices $\underline{WD[r]}$. These working matrices $\underline{WD[r]}$, in this example, are based at least in part on the identity matrix $\underline{I_D}$ and can be determined using the following formula:

$$\underline{WD[r]} = \begin{cases} WD[0] = \underline{I_D} \\ WD_{i,j}[r] = WD_{i-1,j-1}[r], 1 \le r, i \le n; 2 \le j \le n \\ WD_{i,0}[r] = FND[r], 1 \le r \le n \end{cases} \quad (4)$$

where $$FND[r] = (\overrightarrow{WD_1[r-1]} \oplus \vec{A}) \cdot \ldots \cdot (\overrightarrow{WD_0[r-1]} \oplus \vec{A}) \quad (5)$$

The D-matrix $\underline{D}$ can then be extracted from working matrices $\underline{WD[r]}$ by application of the following equation:

$$D_{i,j} = \begin{cases} 0, i > BW \\ WD_{i,j}[BW-1], \text{otherwise} \end{cases} \quad (6)$$

Looking first to the PRBS generator 504, it does not rely on a D-matrix. As shown in FIG. 7, the matrix circuit 602 generates the P-matrix from signal POLYIN as described above. Initially, when the PRBS system is activated, the multiplexer 614 can be set to allow a seed value or vector SEED to be written to register 604. This seed value can, for example, be a pseudorandom number generated from a clock. Once seeded, the multiplexer 614 is set to form a feedback path from the multiplier 606 to registers 604. For each iteration, the multiplier 606 multiplies the the value or vector stored in registers 604. The output from the multiplier 606 can form the output vector DATAOUT. Alternatively, an inverse of the output of multiplier 606 can be used as the output vector DATAOUT by using the inversion circuit 610. In this case the AND gate 612 (which receives a system enable signal EN and inverse enable signal INV), controls the multiplexer 608 such that it outputs the inverse of the output of the inversion circuit 610 as the output vector DATAOUT.

The PRBS checker 508, on the other hand, does use both the P- and D-matrices $\underline{P}$ and $\underline{D}$ and has a function that is similar to the descrambler 506. In operation, the P- and D-matrices $\underline{P}$ and $\underline{D}$ are generated by matrix circuits 702 and 704, respectively, the input data DATAIN for checker 508. This input data DATAIN can also be written to register 710. The multiplier 706 can multiply the input data DATAIN (which can for example be 20-bits wide data vector) by the D-matrix $\underline{D}$. The P-matrix $\underline{P}$ can be multiplied by the information (e.g., vector) stored in register 710 with multiplier 712. The outputs of multipliers 706 and 712 can then be XORed with circuit 908 and output to error counter 718 that generates an error count value ECNT and an error flag ERRORFLG. Alternatively, an inverse of the input data DATAIN when the multiplexer is selected to pass the output of inversion circuit 714; this is typically employed when the generator 504 is selected to output an inverted data vectors (e.g., DATAOUT).

One advantage of having such a flexible PRBS system is that the communication channel can be characterized or optimized. For example, a detector 512 can be included that can control the generator 504 and checker 506. This detector 512 can allow for iterative or repeated PRBS transmission over the communication channel, and, based on the error, adjustments can be made so as to substantially optimize transmission over the communication channel. Alternatively, this detector 512 can be used to determine the type of communication channel (e.g., optical, twisted pair, and so forth) using similar repeated transmissions.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a polynomial register having a plurality of bits, configured to store a user-defined polynomial;
a first bus;
a second bus;
a transceiver coupled to the first bus, the second bus, and the polynomial register, the transceiver including:
a pseudorandom bit sequence (PRBS) generator configured to generate a PRBS signal based on the user-defined polynomial; and
a PRBS checker configured to generate an error signal from a received signal using the user-defined polynomial, the PRBS checker including:
a first matrix circuit configured to include a first matrix corresponding to the user-defined polynomial;
a second matrix circuit configured to include a second matrix corresponding to the user-defined polynomial;
a first multiplier coupled to the second matrix circuit and configured to receive an input associated with the first bus;
a data register configured to receive the input associated with the first bus;
a second multiplier coupled to the first matrix circuit and the data register;
an XOR circuit coupled to the first and second multipliers; and
an error counter coupled to the XOR circuit.

2. The apparatus of claim 1, wherein the first bus further comprises a first input bus and a second input bus, and wherein the second bus further comprises a first output bus and a second output bus, and wherein the PRBS generator is coupled to the first output bus, and wherein the PRBS checker is coupled to the second input bus.

3. The apparatus of claim 2, wherein the first input bus has a programmable width.

4. The apparatus of claim 1, wherein the PRBS generator includes:
a third matrix circuit configured to include a third matrix corresponding to the user-defined polynomial;
a second data register;
a third multiplier coupled to the third matrix circuit and the second data register;
a first multiplexer that is coupled to the third multiplier and that is configured to receive a seed;
a second multiplexer that is coupled to the first multiplexer and the second data register.

5. The apparatus of claim 4, wherein the transceiver further comprises a detector that is coupled to the PRBS generator and the PRBS checker.

6. The apparatus of claim 4, wherein the polynomial register has 32 bits.

7. An apparatus comprising:
a media access control (MAC) circuit;
an interface coupled to the MAC circuit;
a physical transceiver (PHY) having:
a polynomial register having a plurality of bits, configured to store a user-defined polynomial;
a first bus coupled to the interface;
a second bus;
a transceiver coupled to the first bus, the second bus, and the polynomial register, the transceiver including:
a pseudorandom bit sequence (PRBS) generator configured to generate a PRBS signal based on the user-defined polynomial; and
a PRBS checker configured to generate an error signal from a received signal using the user-defined polynomial, the PRBS checker including:
a first matrix circuit configured to include a first matrix corresponding to the user-defined polynomial;
a second matrix circuit configured to include a second matrix corresponding to the user-defined polynomial;
a first multiplier coupled to the second matrix circuit and configured to receive an input associated with the first bus;
a data register configured to receive the input associated with the first bus;
a second multiplier coupled to the first matrix circuit and the data register;
an XOR circuit coupled to the first and second multipliers; and
an error counter coupled to the XOR circuit.

8. The apparatus of claim 7, wherein the first bus has a programmable width.

9. The apparatus of claim 7, wherein the PRBS generator includes:
a third matrix circuit configured to include a third matrix corresponding to the user-defined polynomial;
a second data register;
a third multiplier coupled to the third matrix circuit and the second data register;
a first multiplexer coupled to the third multiplier and that is configured to receive a seed;
a second multiplexer that is coupled to the first multiplexer and the second data register.

10. The apparatus of claim 9, wherein the PHY further comprises a detector that is coupled to the PRBS generator and the PRBS checker.

11. The apparatus of claim 10, wherein the apparatus further comprises a communications medium that is coupled to the PHY.

12. The apparatus of claim 11, wherein the detector is configured to use the PRBS generator and the PRBS checker to characterize the communications medium.

13. The apparatus of claim 12, wherein the apparatus further comprises a host that is coupled to the MAC circuit.

14. The apparatus of claim 13, wherein the polynomial register has 32 bits.

\* \* \* \* \*